United States Patent [19]
Shyi et al.

[11] Patent Number: 5,426,756
[45] Date of Patent: Jun. 20, 1995

[54] MEMORY CONTROLLER AND METHOD DETERMINING EMPTY/FULL STATUS OF A FIFO MEMORY USING GRAY CODE COUNTERS

[75] Inventors: Jonathan Shyi; Kenny Shen, both of San Jose, Calif.

[73] Assignee: S3, Incorporated, Santa Clara, Calif.

[21] Appl. No.: 928,552

[22] Filed: Aug. 11, 1992

[51] Int. Cl.$^6$ .................. G06F 12/00; G11C 7/00; G11C 19/00; H03K 21/00

[52] U.S. Cl. .................. 395/425; 365/189.07; 365/221; 365/236; 364/DIG. 1; 377/34; 377/39

[58] Field of Search .................. 395/425, 550; 377/34, 377/39; 365/221, 236, 189.07

[56] References Cited

U.S. PATENT DOCUMENTS

| | | | |
|---|---|---|---|
| 4,748,588 | 5/1988 | Norman et al. | 395/550 |
| 5,084,841 | 1/1992 | Williams et al. | 365/189.07 |
| 5,220,586 | 6/1993 | Tai | 365/189.07 |
| 5,267,191 | 11/1993 | Simpson | 365/189.04 |

*Primary Examiner*—Glenn Gossage
*Attorney, Agent, or Firm*—Skjerven, Morrill, MacPherson, Franklin & Friel; Norman R. Klivans, Jr.

[57] ABSTRACT

A controller for asynchronous configurable FIFO (first-in-first-out) memory includes, in addition to two binary counters for the read pointer and write pointer, two Gray code counters for determining whether the FIFO is full or empty by a comparison of the read pointer and write pointer values expressed in Gray code. The Gray code counters avoid the problem of asynchronicity of read and write signals. The Gray code counters determine if the FIFO is full or empty depending on whether the pointer values match (indicating empty) or differ in accordance with particular Gray code patterns (indicating full). The Gray code counters each have an extra bit which allows determination of the full or empty condition from a straightforward comparison of the read pointer and write pointer values, while the Gray code eliminates the problem of multiple bit transition providing an incorrect indication of the pointer location. The controller is implemented in logic circuitry which is configurable depending on the FIFO configuration and system configuration considerations.

11 Claims, 23 Drawing Sheets

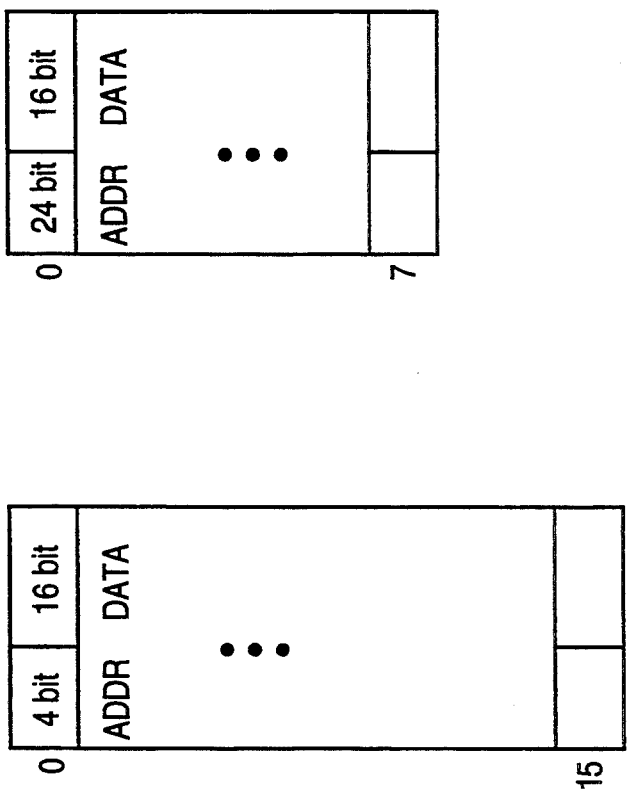

| Gray Code | Condition of Full generation |
|---|---|
| 0 0 0 0 0 | 16 deep FIFO |
| 0 0 0 0 1 | |
| 0 0 0 1 1 | $R4 = \overline{W4}$ ; $R3 + \overline{W3}$ ; $R[2:0] = W[2:0]$ |
| 0 0 0 1 0 | |
| 0 0 1 1 0 | |
| 0 0 1 1 1 | 8 deep FIFO |
| 0 0 1 0 1 | |
| 0 0 1 0 0 | $R[4:3] \neq W[4:3]$ ; $R2 = \overline{W2}$ ; $R[1:0] = W[1:0]$ |
| 0 1 1 0 0 | |
| 0 1 1 0 1 | |
| 0 1 1 1 1 | 4 deep FIFO |
| 0 1 1 1 0 | |
| | $R[4:2] \neq W[4:2]$ ; $R1 = \overline{W1}$ ; $R0 = W0$ |
| 0 1 0 1 0 | |
| 0 1 0 1 1 | |
| 0 1 0 0 1 | |
| 0 1 0 0 0 | 2 deep FIFO |
| 1 1 0 0 0 | $R[4:1] \neq W[4:1]$ ; $R0 = \overline{W0}$ |
| 1 1 0 0 1 | |
| 1 1 0 1 1 | |
| 1 1 0 1 0 | |
| 1 1 1 1 0 | |
| 1 1 1 1 1 | 1 deep FIFO |
| 1 1 1 0 1 | |
| 1 1 1 0 0 | $R[4:0] \neq W[4:0]$ |
| 1 0 1 0 0 | |
| 1 0 1 0 1 | |
| 1 0 1 1 1 | |
| 1 0 1 1 0 | |
| 1 0 0 1 0 | |
| 1 0 0 1 1 | |
| 1 0 0 0 1 | |
| 1 0 0 0 0 | |

Condition of EMPTY Generation :
$R[4:0] = W[4:0]$

FIG. 6

MEMORY CONTROLLER AND METHOD DETERMINING EMPTY/FULL STATUS OF A FIFO MEMORY USING GRAY CODE COUNTERS

BACKGROUND OF THE INVENTION

This invention relates to control of configurable asynchronous FIFO (first-in-first-out) memory and more specifically to a memory controller for controlling a memory such as a FIFO memory in which the write signal is asynchronous to the read signal and the memory itself is configurable in terms of width and depth.

DESCRIPTION OF THE PRIOR ART

FIG. 1 shows a typical prior art asynchronous FIFO system. Data is written into FIFO memory 10 ("FIFO") by write data path 12 and read out by read data path 14. Write data path 12 is controlled by a write enable signal 16. Read data path 14 is controlled by a read enable signal 18. A FIFO control block 24 generates a write pointer and a read pointer (both designated by reference number 20) for the FIFO memory 10. The write pointer indicates the memory location currently being written to. The read pointer indicates the memory location being read from. To avoid FIFO 10 overflow and underflow, two status flags must be generated, based on the write pointer and the read pointer. The "full" flag 26 indicates that the FIFO 10 is full and therefore no more data can be written to it. The "empty" flag 28 indicates that the FIFO 10 is empty and hence no more data can be read from it. The "write data" 12, "write enable" 16, "write pointer" 20 and "full" 26 signals are synchronous to the write clock. The "read data 14, "read enable" 18, "read pointer" 20 and "empty" 28 signals are synchronous to the read clock. The asynchronicity of the write pointer and the read pointer requires the control block 24 to synchronize and compare the pointers 20 for the generation of the full and empty flags 26, 28.

A FIFO memory 10 may be a configurable type memory as shown in FIGS. 2a, 2b and 2c, showing respectively three different configurations of a single FIFO memory, each having 320 bits. This will further complicate the full and empty flag generation.

A configurable asynchronous FIFO memory system as illustrated in FIG. 1 presents two problems, the first of which is depicted in FIGS. 3a, 3b and 3c. FIG. 3a depicts the FIFO graphically as a stack of memory locations with the write pointer WR pointing to one memory location and the read pointer RD pointing to another memory location. The read signal (which is synchronous to the memory clock (MCLK) signal) is asynchronous to the system clock SCLK signal (to which the write signal is synchronized), so the two read, write signal waveforms may encounter the problem shown in FIG. 3c if SCLK has a much lower (lower than ½) frequency than MCLK. As seen in FIG. 3c, the RD signal will not be received in response to SCLK and consequently the output of block 32 in FIG. 3b cannot be activated, which will keep the FULL signal high (because there is no clear or reset signal from the output of block 32) if the RD signal is not received in response to SCLK.

The second problem encountered with configurable asynchronous FIFO memories is illustrated in FIG. 4, and is even more severe than that illustrated in FIG. 3c. This is the need to synchronize the read pointer signal which indicates from which memory location data is being read to the SCLK signal. As shown in FIG. 4, if the read pointer signal (4 bits, 0, 1, 2, and 3) is skewed relative to the SCLK signal it is possible to the wrong value of the read pointer. Clearly the exact location of the leading edge of the SCLK signal will determine which portions of the read pointer signal, i.e. which of the bits, is being received and may result in a wrongful pointer value due to a very slight timing difference. Thus read pointer, write pointer synchronization is quite difficult to do in the prior art system and a slight timing error will result in an incorrect read pointer value, i.e. generate incorrect empty or full flags. A prior art attempted solution to the problem of FIG. 4 is careful custom circuit layout to resolve the asynchronicity issue so as to provide the write signal on a line of an exact length to achieve proper timing. But, this does not actually solve the problem. Clearly such an attempted solution is not applicable at all to, for instance, ASIC integrated circuits, and is problematic even in the design of customized integrated circuits.

Thus clearly the prior art approaches to provision of configurable asynchronous FIFO memory are detrimental to performance, relatively difficult to design, and limited in their design applications.

SUMMARY OF THE INVENTION

In accordance with the invention, an asynchronous FIFO memory controller having four counters is provided for a configurable FIFO memory. Of the four counters, two are conventional binary counters for FIFO memory addressing (as used in the prior art FIFO memory controllers) and the other two are Gray code counters for determination of the full and empty conditions of the FIFO. The binary counters conventionally maintain the read and write pointer values. The Gray code counters directly determine if the FIFO is currently full or empty, rather than attempting to predict if the next reading or writing of data will generate a full or empty signal as in the prior art. Thus there is no need to use complicated logic to solve the asynchronicity problem of FIG. 3. The Gray code counter in accordance with the invention has one more bit than is necessary to count the actual number of memory locations, with the extra bit being a carry bit to differentiate empty and full status.

The second prior art problem as in FIG. 4 is overcome in accordance with the invention by the two Gray code counters, one for writing and one for reading, to generate full and empty flags. A Gray code counter advances with one bit change, and therefore sampling the counter always yields a good count.

The system in accordance with the invention is applicable to any depth of FIFO and in one embodiment is carried out in logic gates, thus providing high speed performance for memory control using exclusive OR gates as the basis of the logic. In one version, the FIFO controller in accordance with the invention is a CPU (central processing unit) interface portion of a graphics controller integrated circuit. The FIFO controller is connected at the interface between an external CPU and an internal graphics controller. It is to be understood that the present invention is not limited to control of FIFO memories or control of memories at all. In other versions, a system in accordance with the invention is used to control reading and writing of external data to a memory or any other structure where the read path is different from and asynchronous to the write path. Thus this has general application to computer systems, in addition to specifically being applicable to FIFO memory control.

BRIEF DESCRIPTION OF THE DRAWINGS

FIGS. 2a, 2b, and 2c show configurable FIFO memories.

FIG. 6 shows a table of Gray codes in accordance with the present invention.

DETAILED DESCRIPTION OF THE INVENTION

Figure 5:
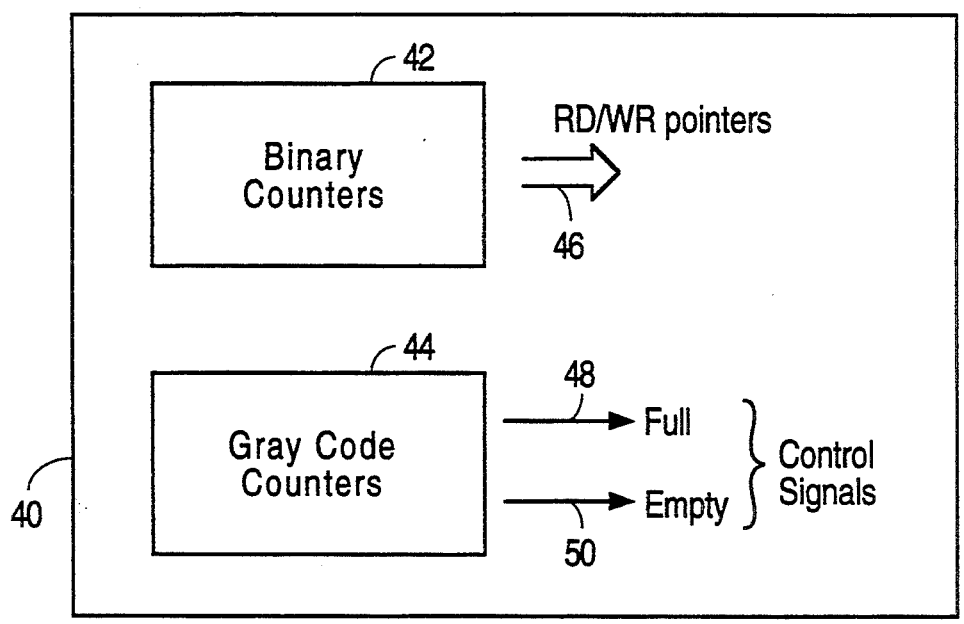
FIG. 5 shows a block diagram of a FIFO memory controller in accordance with the present invention.

FIG. 5 shows in a block diagram a FIFO memory controller 40 in accordance with the invention. Included are two binary counters both designated by block 42, one of which is a conventional binary counter for the FIFO read pointer and the second of which is a conventional binary counter for the FIFO write pointer. In the example shown for instance in FIG. 2 for a configurable FIFO memory having a maximum of 16 entries, each of these binary counters is a 4 bit counter.

Figure 1:
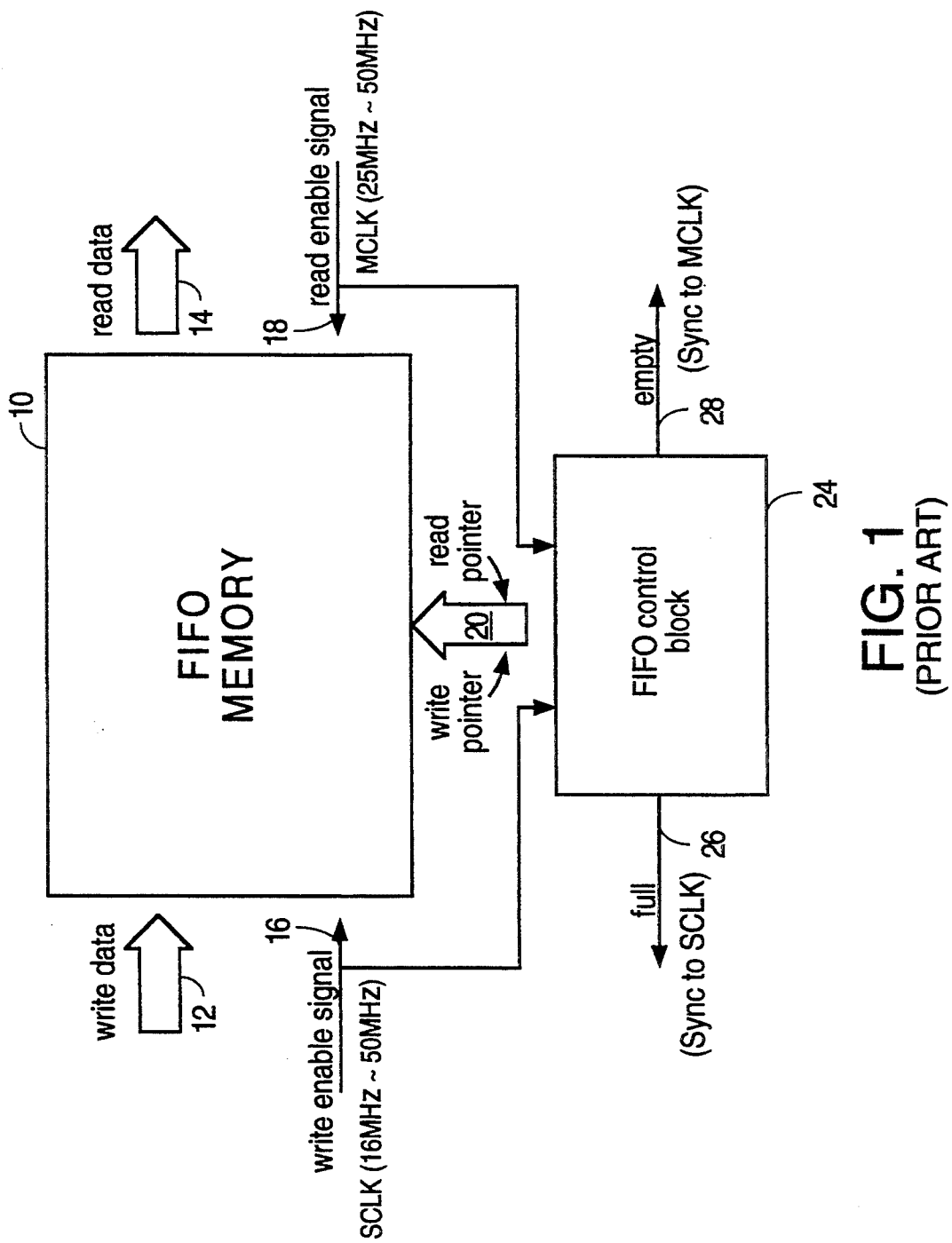
FIG. 1 shows a prior art FIFO memory system.
Figure 3B:
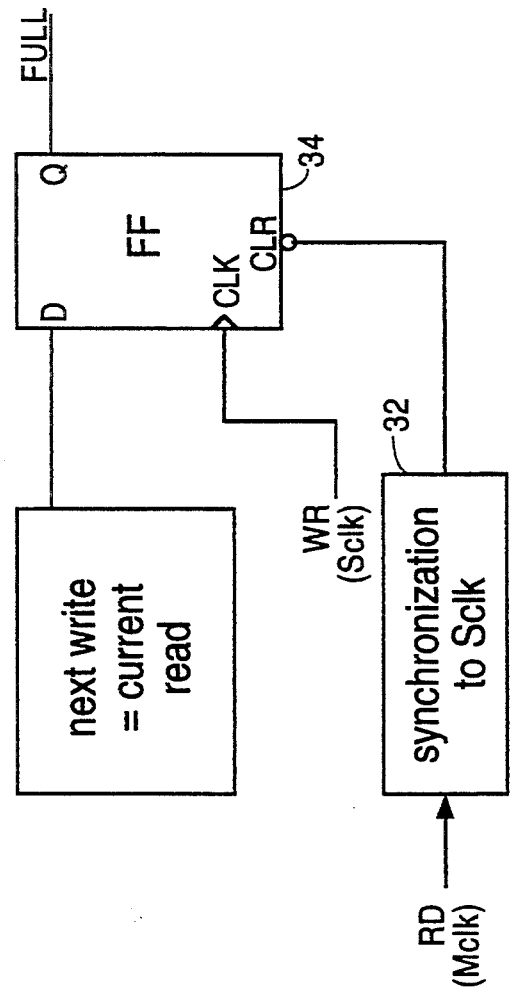
FIGS. 3a, 3b, and 3c show the problem of read/write asynchronicity in the prior art.
Figure 3A:
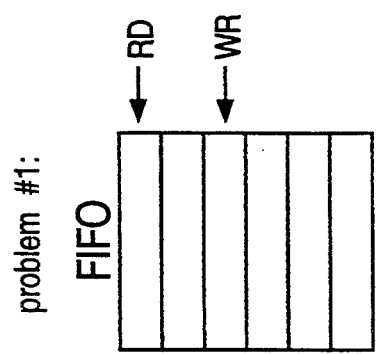
Figure 3C:
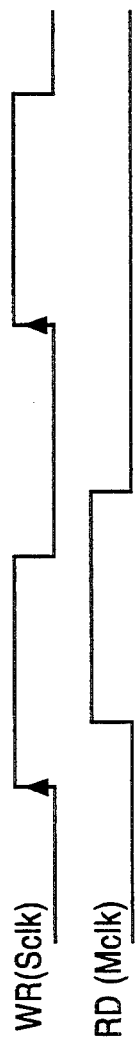

Also included in memory controller 40 are two Gray code counters both designated by block 44 which provide the FIFO full signal 48 and the the FIFO empty signal 50. Signals 48, 50 indicate the status of the FIFO memory for control of reading and writing thereto. In each of the two Gray code counters in block 44, there is one extra bit over that needed to count the number of memory locations i.e., for a FIFO having a maximum of 16 memory locations, five bits are provided in each Gray code counter. This extra "carry" bit overcomes the complex problem of predicting empty/full status and sampling the full/empty flags as shown in FIG. 3c.

Figure 4:
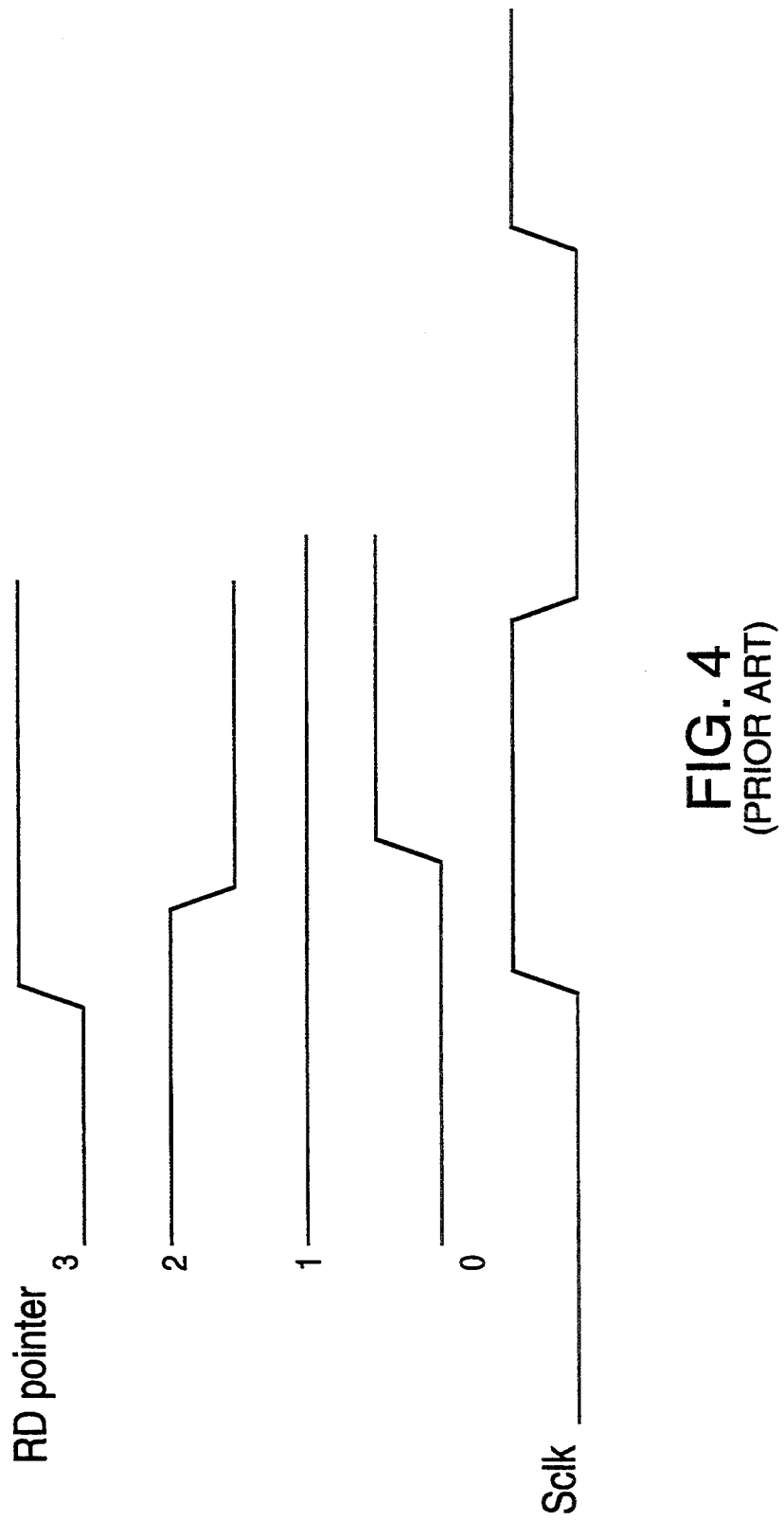
FIG. 4 shows the problem of time skewing of read and write signals in the prior art.

Each Gray code counter is used in accordance with the Gray code counting method described below to solve the problem shown in FIG. 4 of read/write pointer synchronization skewing.

Gray code is a well-known method of expressing numbers which minimizes bit changes between successive numbers when expressed in binary notation. Each successive integer is represented by only one bit changing. A Gray code count from 0 to 31 is shown in FIG. 6 in the left hand column, where the first number in the column is 0 and the last number is 31 expressed in Gray code. It can be seen that for any two successive numbers in this table only one bit changes between the numbers, which is different from ordinary binary notation.

The Gray code numbers shown in the left hand column of FIG. 6 are in 5 bits, the right hand bit being bit number 0 and the left hand (most significant) bit being bit number 4 as is conventional.

Since the read pointer and write pointer are synchronized to two different clocks, pointer synchronization is necessary for the purpose of producing good and reliable FIFO empty and full status flags (signals). As shown in FIG. 4, sampling a counter with multiple bit changes can generate a bad count, which in turn corrupts the integrity of the empty and full status flags. With the Gray code counter, only one bit change is possible at any moment. Sampling the Gray code counter thus can only generate two possible results: the current count or the next count. Both are good counts, so the integrity of the full/empty status flags is thus guaranteed.

Such a table as in FIG. 6, embodied in exclusive OR gate logic as a comparator, is used in accordance with the invention and the Gray code counters of FIG. 5. There is one Gray code counter for the read pointer and a second Gray code counter for the write pointer which are used in conjunction to determine whether the FIFO is full or empty. In every case the empty condition is that all of the bits in the read pointer counter are equal to all of the bits in the write pointer counter. This is expressed as R[4:0]=W[4:0]. It is understood that "empty" means that the read pointer is pointing to the same memory location as is the write pointer. This is of course true for all size FIFOs.

The condition of the FIFO being full is defined by one of several predetermined conditions depending on the depth (number of entries) of the FIFO. These predetermined conditions are shown in the right hand column of FIG. 6. Thus for a 16 deep FIFO this is expressed in notation indicating that bit 4 in the read counter (R) is equal to the inverse of bit 4 in the write counter (W). The bit 3 in the read counter is equal to the inverse of bit 3 in the write counter, and bits 0, 1 and 2 in the read counter are each equal to corresponding bits 0, 1 and 2 in the write counter.

Similarly, for an 8 entry deep FIFO, the condition of full is met when bit 3 and bit 4 in the read counter are not equal to bit 3 and bit 4 in the write counter, bit 2 in the read counter is equal to the inverse of bit 2 in the write counter, and bit 0 and bit 1 in the read counter are equal to bit 0 and bit 1 in the write counter.

Similar rules are (as shown) defined for the 4 deep FIFO and the 2 deep FIFO. For the 1 deep FIFO as shown, the full condition is generated whenever all four bits in the read counter are not equal to all four bits in the write counter as would be intuitively understood i.e., the one deep FIFO is either full or empty with full being the opposite of empty. This is further understood with regard to the left hand column Gray code count of FIG. 6. Thus for the 16 deep FIFO for instance if the read counter holds the digits 00000 (the first entry in the table) then full will be generated if, and only if, the other counter, (the write counter) includes the digits 11000 which is the seventeenth entry in the table. It can be seen that for the seventeenth entry, bit 4 of the read counter is equal to the inverse of bit 4 of the write counter, and bit 3 of the read counter is equal to the inverse of the third bit in the write counter, and the three least significant bits 0, 1 and 2 are equal in the two entries. A similar relationship exists between the second entry in the table, i.e. the Gray code for number 1 which is 00001 and the eighteenth entry in the table which is 11001. Thus again if the read counter is the number 000001 and the write counter is the number 11001 the full condition will be generated i.e., the FIFO is full; thus there are 15 entries between the read counter value and the write counter value for a 16 entry deep FIFO.

It is to be understood that if the logic is such that if neither the empty condition is present nor the full condition is present, then some intermediate FIFO partly full condition is present and there is no need to generate the full or empty control signals (flags). This approach is superior to the prior art shown in FIG. 3b which requires a flip-flop and the associated logic to predict whether the next entry will be full, and waiting for the read signal to occur to reset the flip-flop 34 to zero. It is noted that the table in FIG. 6 (while it will support a maximum of sixteen entries in the FIFO) includes five bits i.e., has one extra bit designated above as the carry bit.

Thus it can be seen that the comparison of the values held in the two Gray code counters can be performed by exclusive OR gates comparing values on a bit-by-bit basis to arrive at the comparisons as needed for the various depths of FIFOs as shown in the right hand column of FIG. 6.

Referring to FIGS. 7a, 7b, 7c, and 7d, these show in greater detail the circuitry 40 of FIG. 5. The binary counter designated "BYCNT" 42 in FIG. 7a has two outputs, the first of which is the read pointer 46A and the second of which is the write pointer 46B, each of which are 4 bit values. Similarly, the Gray code counters 44 of FIG. 7b designated "GCCNT" include in their outputs the full indication designated FULLB 48 and the empty indication designated EMPTYB 50.

Figure 7A:
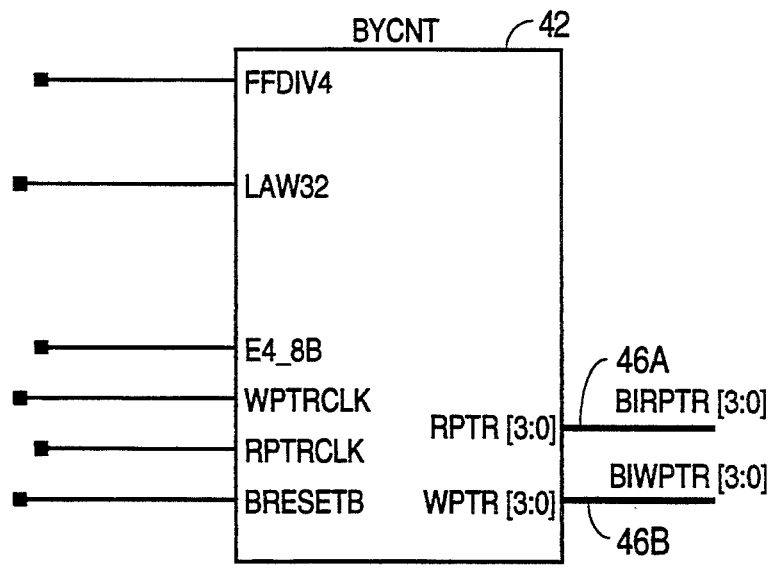
FIGS. 7a, 7b, 7c, and 7d show in greater detail the structure of the FIFO memory controller of FIG. 5.
Figure 7D:
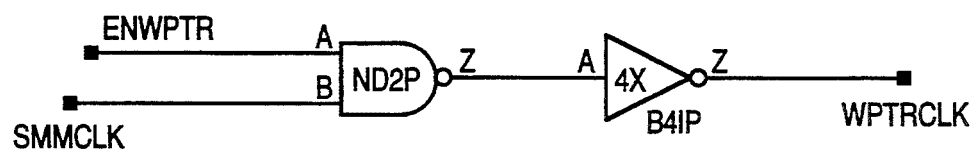

The two most important inputs to the binary counters 42 are the write pointer clock WPTRCLK and the read pointer clock RPTRCLK. As shown in FIG. 7c, the read pointer clock RPTRCLK is generated by logic circuitry 51 from three signals, one of which is MCLK (the memory clock), the second of which is the GRD command (Graphics Mode read) GRDCMD, and the third of which is the VRD command (VGA mode read) VRDCMD. Also generated from these signals is enable read pointer signal ENRPTRB. Similarly as shown in FIG. 7d, the write pointer clock WPTRCLK is generated from the enable write pointer signal and the SMMCLK signal. (SMMCLK is the same as SMCLK) which is the system clock signal. FFDIV4, LAW32, SELMM32, ISAEISA, and E4_8B (inputs to BYCNT 42 and GCCNT 44) are control bits indicating different FIFO configurations.

The Gray code counters 44 as shown have the various inputs on the left hand portion of block 44. The read pointer is a five bit signal designated GCRPTR and the write pointer (synchronized to the MCLK) is a five bit signal GCWPTRM. The output signal CMDAV from the Gray code counter CMDAV indicates that the FIFO is not empty (and also not full) and it has commands available in the FIFO entries. CMDAV is used by logic circuitry to generate four signals BCMDAV, BFVCMDAV, VCMDAV and TCMDAVB. These mean:

BCMDAV: Command available for Graphic engine
VCMDAV: Command available for VGA mode
BFRCMDAV: buffered VCMDAV.
TCMDAVB: either BCMDAV or VCMDAV FIGS. 8a to 8d show detail of the binary counter 42 BYCNT block of FIG. 7a. Note that the inputs are the same as shown to block 42 in FIG. 7 and the outputs are on two 4 bit buses, one the write pointer WPTR and the second the read pointer RPTR, each of which is a four bit signal. The LAWCNT block in FIG. 8c controls counting for the situation where the FIFO entries are 32 bits wide. In this case, it is desired to write two consecutive 16 bit words into FIFO without an intervening interrupt and to count this single 32 bit entry twice (as two FIFO entries). Note that the inputs E4_8B and LAW32 are configuration information set by a programmer of the system programming certain bits to indicate the FIFO configuration. These configuration bits are:

| E4-8B | LAW32 | Configuration |
|---|---|---|
| 0 | 0 | FIG. 2a |
| 1 | 0 | FIG. 2b |
| 0 | 1 | Not allowed |
| 1 | 1 | FIG. 2C |

Note that the structure of FIGS. 8a to 8d is essentially two similar counters, one for the write pointer at the top and the second for the read pointer at the bottom, which are very similar and essentially mirror images of each other.

Figure 7B:
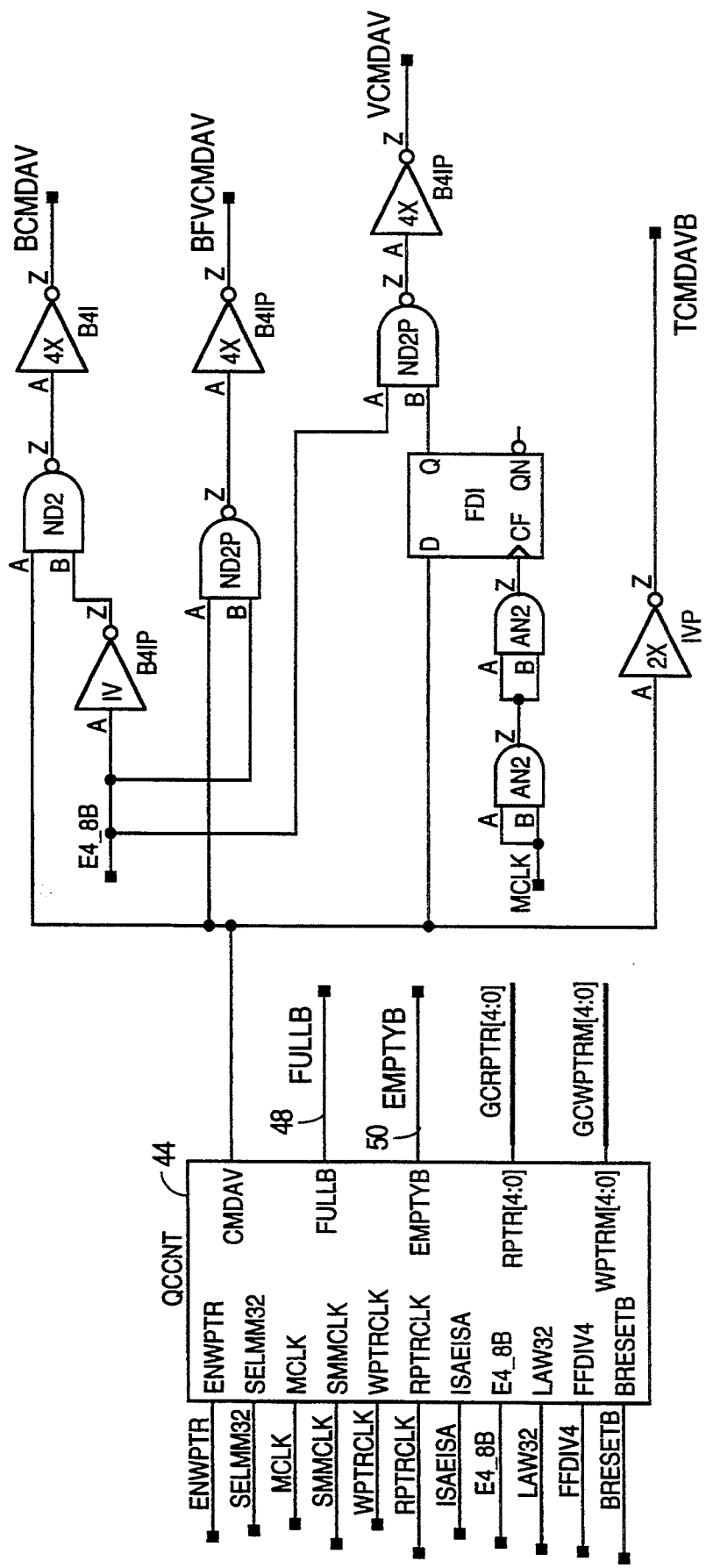
Figure 7C:
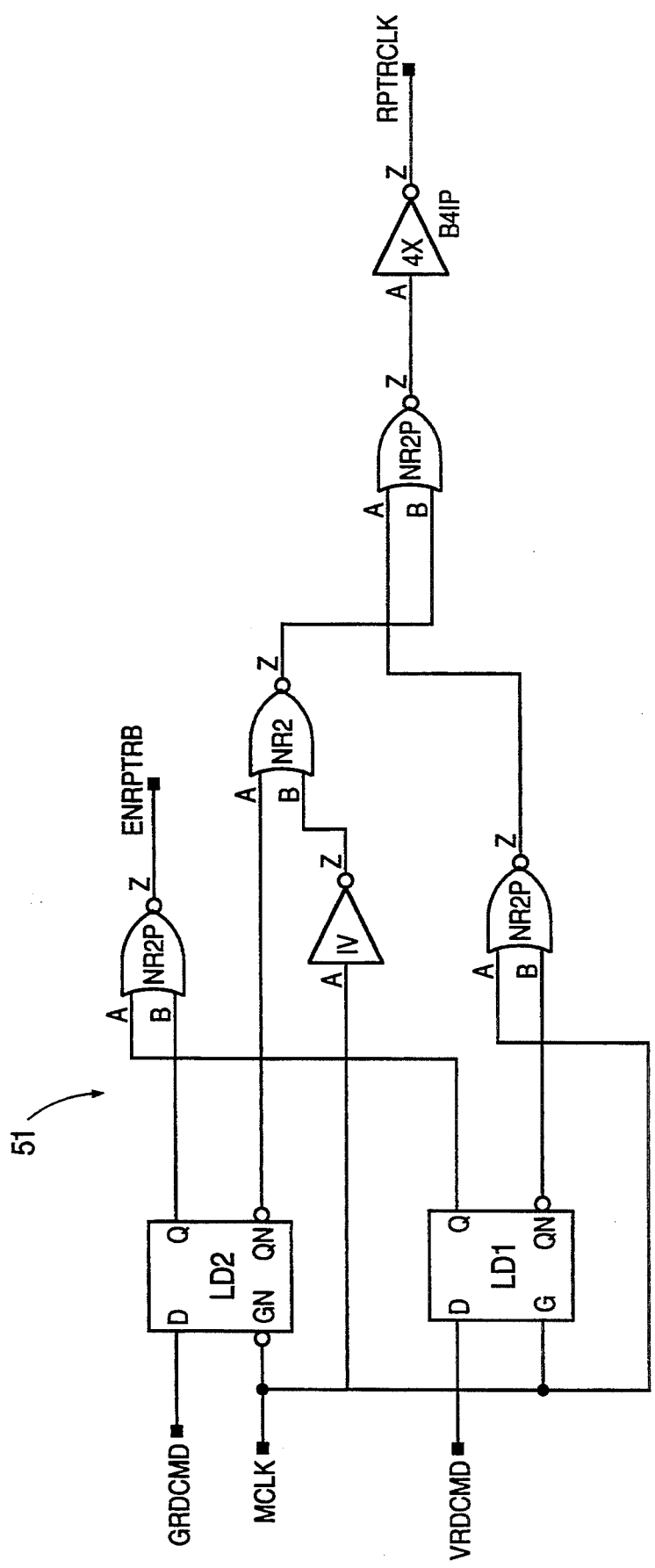
Figure 8A:
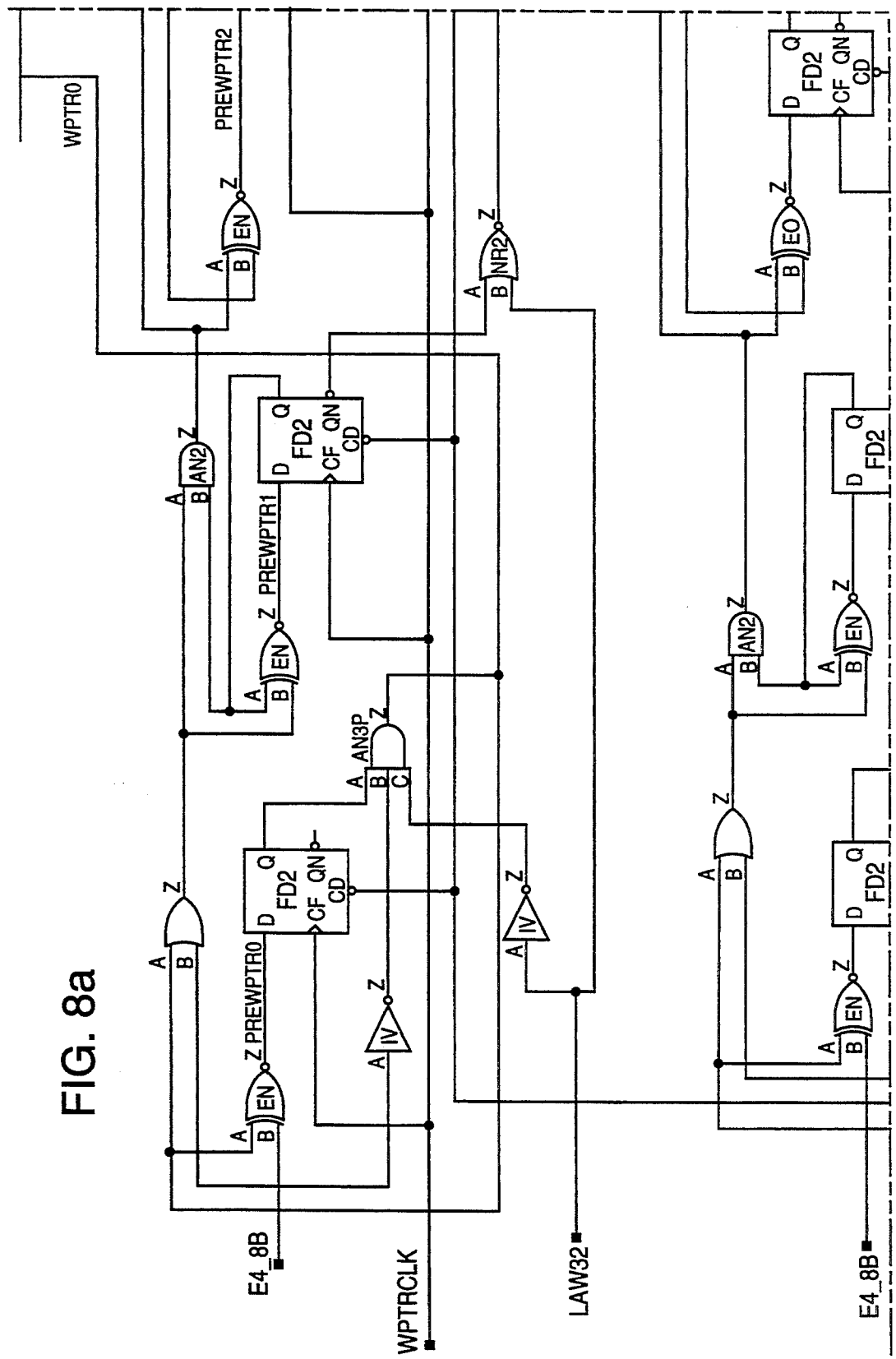
FIGS. 8a to 8d show in greater detail the structure of the Gray code counter block of the FIFO memory controller of FIGS. 7a to 7d.
Figure 8B:
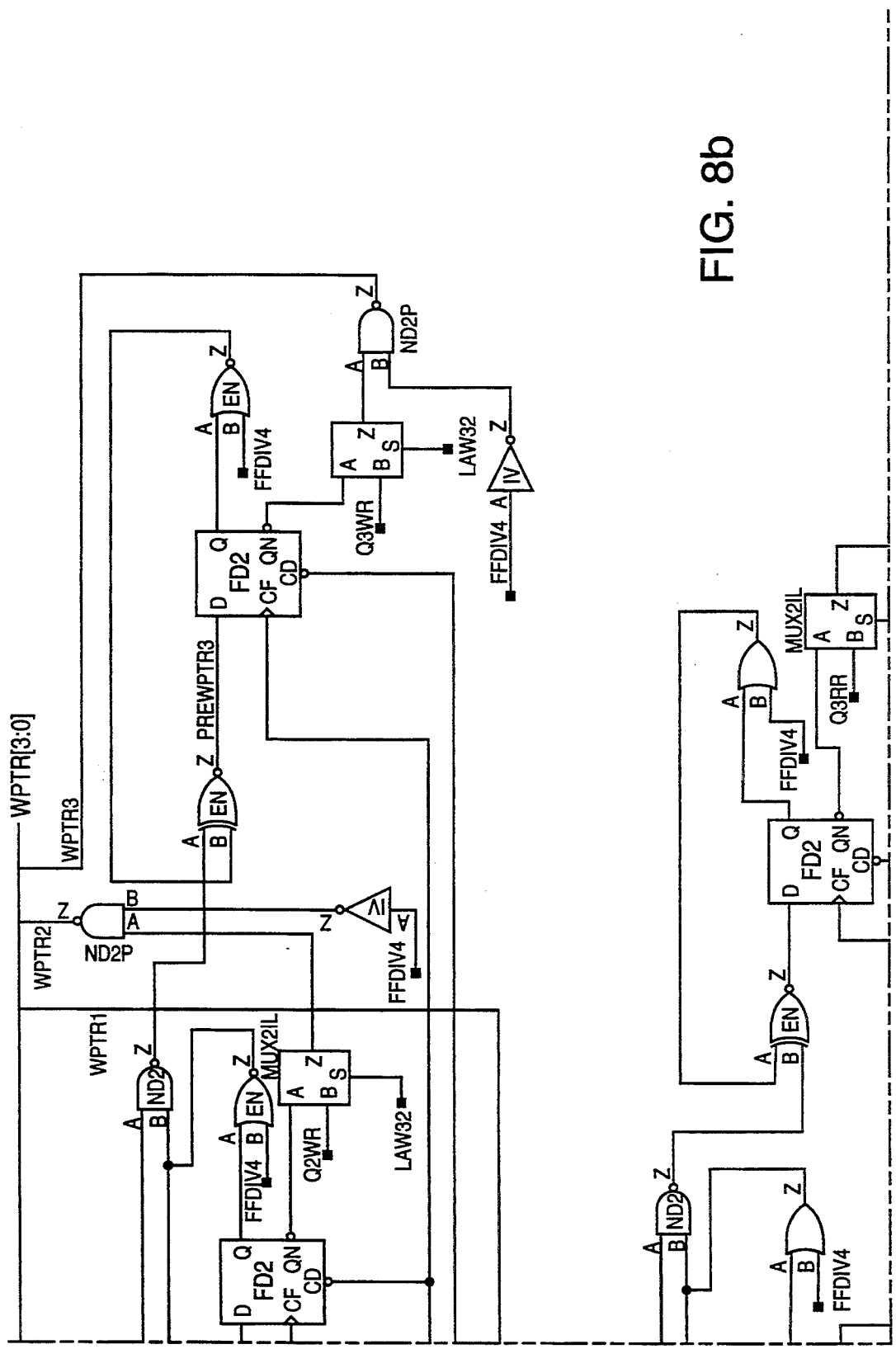
Figure 8C:
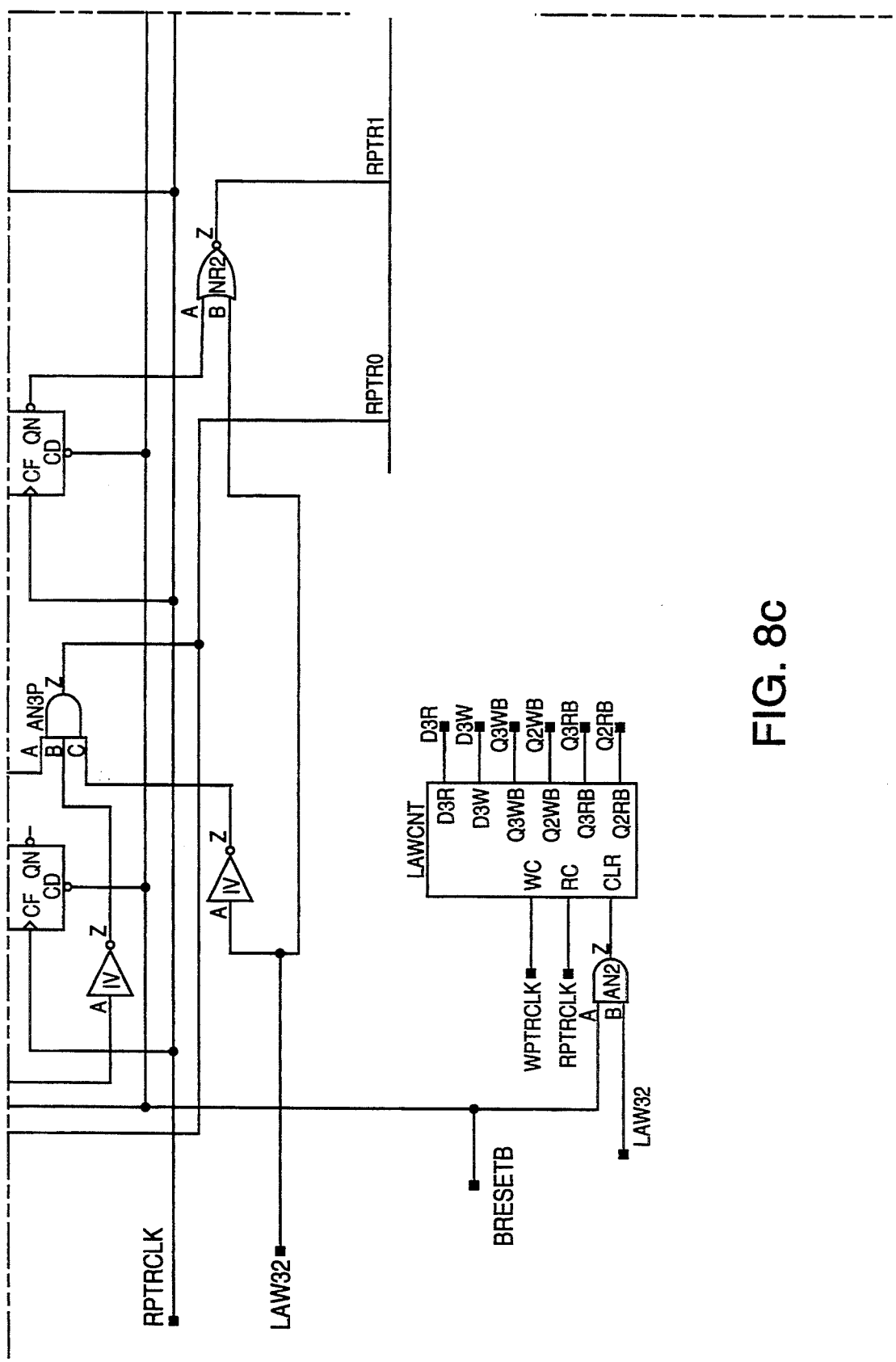
Figure 8D:
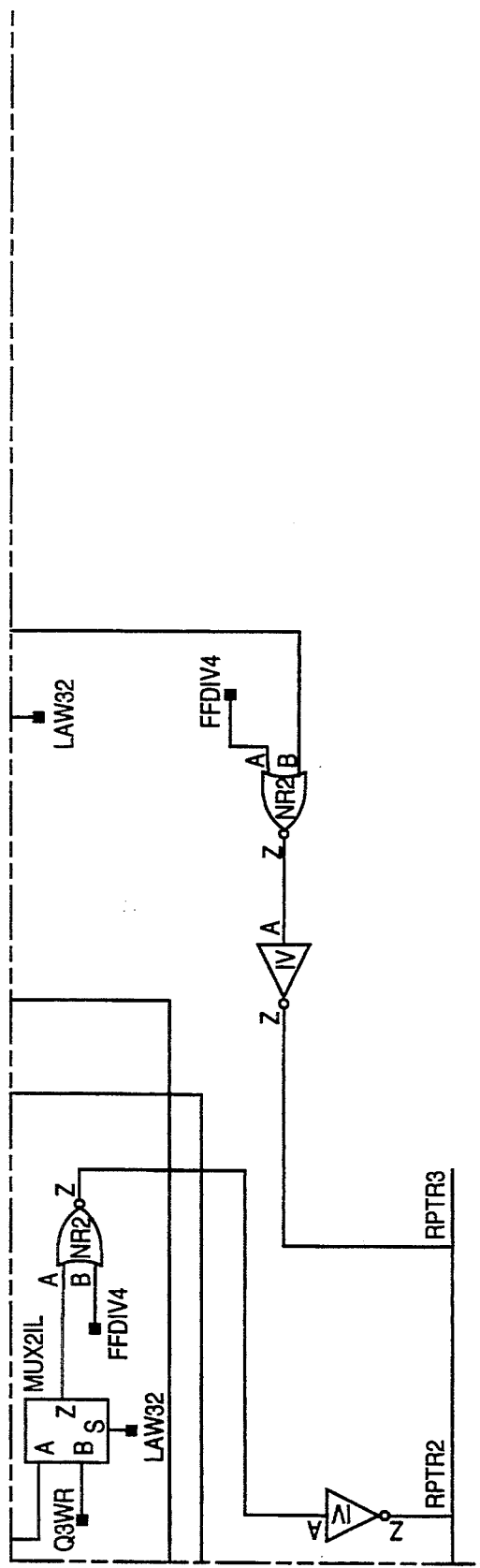

FIGS. 9a to 9d show in detail the Gray code counter block 44 of FIG. 7b. The outputs are (from the top to bottom of the right hand portion of FIGS. 9b and 9d) the FIFO full signal FULLB, the FIFO partially occupied signal CMDAV, and the FIFO empty signal EMPTYB. As can be seen, the empty signal EMPTYB is generated by a set of exclusive NOR gates comparing bit-by-bit the write pointer WPTR to the synchronized read pointer RPTRS, the output of the exclusive NOR gates being NAND'd together.

Figure 9A:
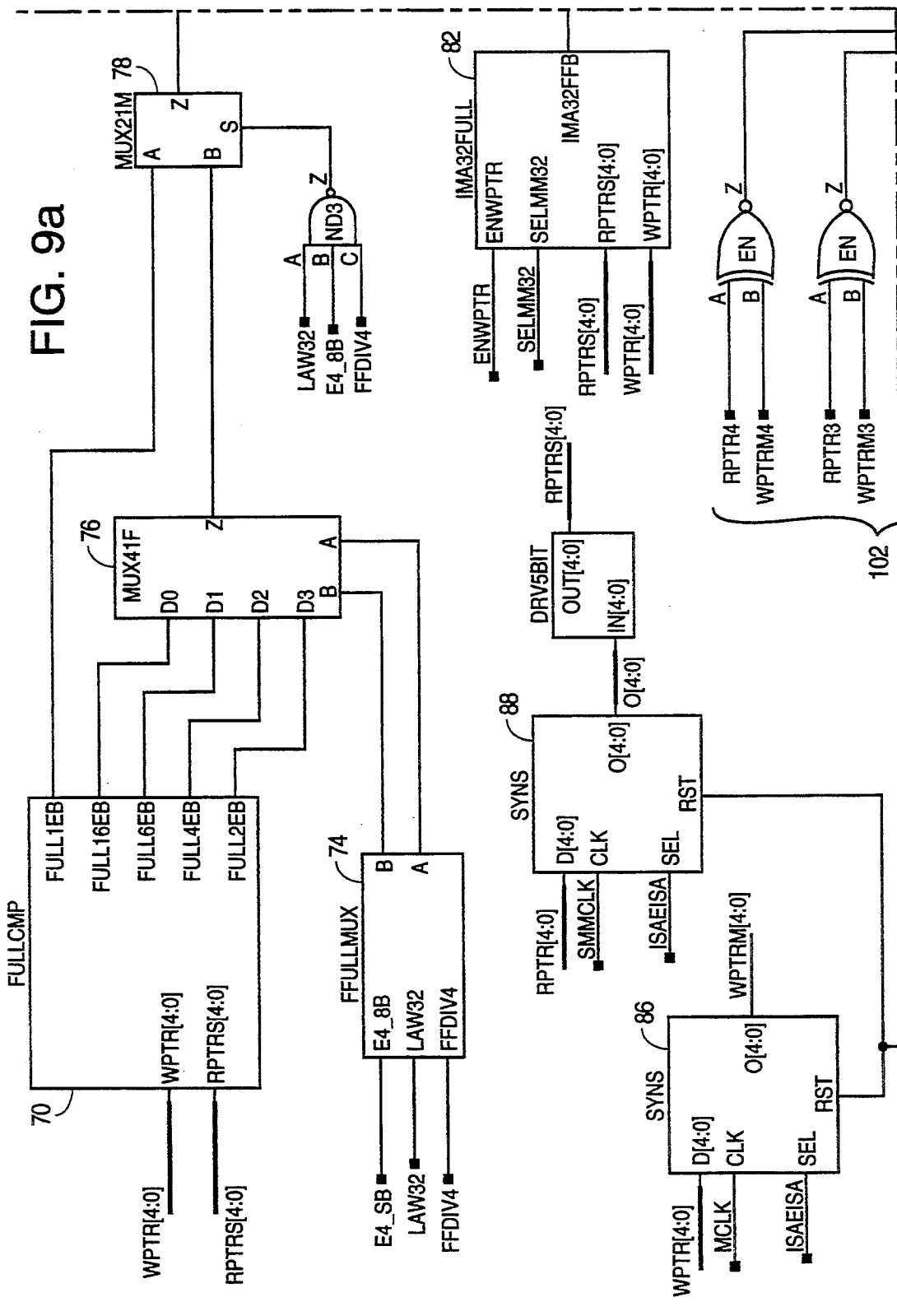
FIGS. 9a to 9d show in greater detail the structure of the Gray code counter block of the FIFO memory controller of FIGS. 7a to 7d.
Figure 9B:
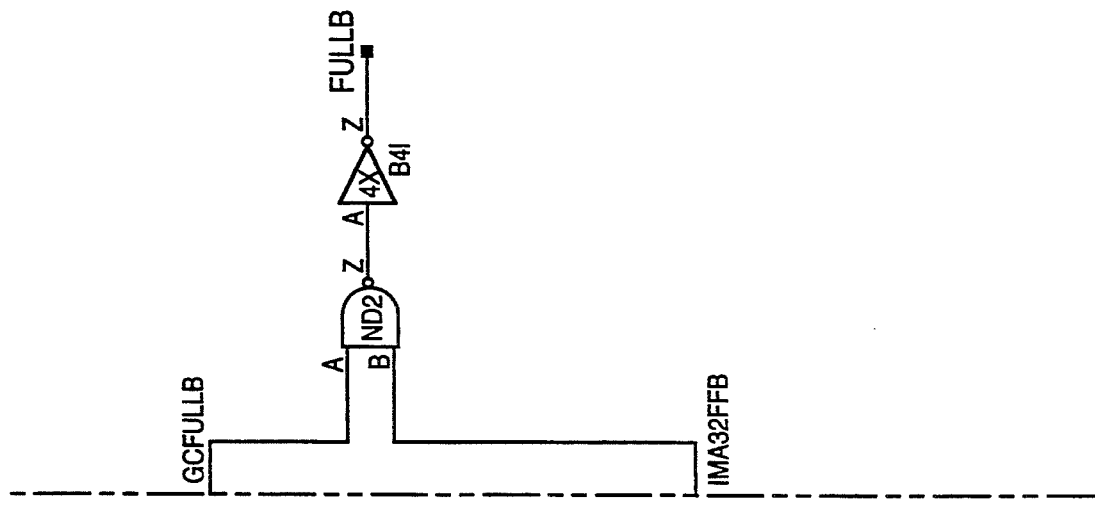

Similarly, the output signal CMDAV is a result of exclusive NOR comparisons on a bit-by-bit basis of the read pointer RPTR and the synchronized write pointer WPTRM (synchronized to the MCLK signal). Also in FIG. 9a is the full condition comparator FULLCMP 70 which compares the write pointer WPTR to the synchronized read pointer RPTRS on a bit-by-bit basis and provides an output for each depth of FIFO for 1, 2, 4, 8 and 16 entries. Below comparator 70 is the multiplexer block FFULLMUX 74 which uses as input the configuration information relating to the system and thus drives multiplexer MUX41P 76 which determines which output of comparator 70 will be used to generate the full signal FULLB, as further controlled by multiplexer 78 in response to the identical configuration signals LAW32, E4_8B and FFDIV4.

Also in FIG. 9a is block IMA32FULL 82 which performs the function of burst mode write for 32 bits (see above description of LAWCNT). Also shown are synchronizers 88 and 86 which are conventional five bit synchronizers (each being two flip-flops) for respectively generating the read pointer output signal RPTRS and the write pointer output signal WPTRM for pointer comparison, used to generate the EMPTYB and CMDAV signals as described above. CMDAV indicates a partially occupied FIFO. Note that synchronizer 88 synchronizes the read pointer to the write clock signal SMMCLK, and synchronizer 86 synchronizes the write ponter to the read clock signal, in both cases as selected by the ISAEISA bus configuration signal. (When the bus is ISA or EISA type no synchronization by synchronizers 86,88 is needed.)

Figure 9C:
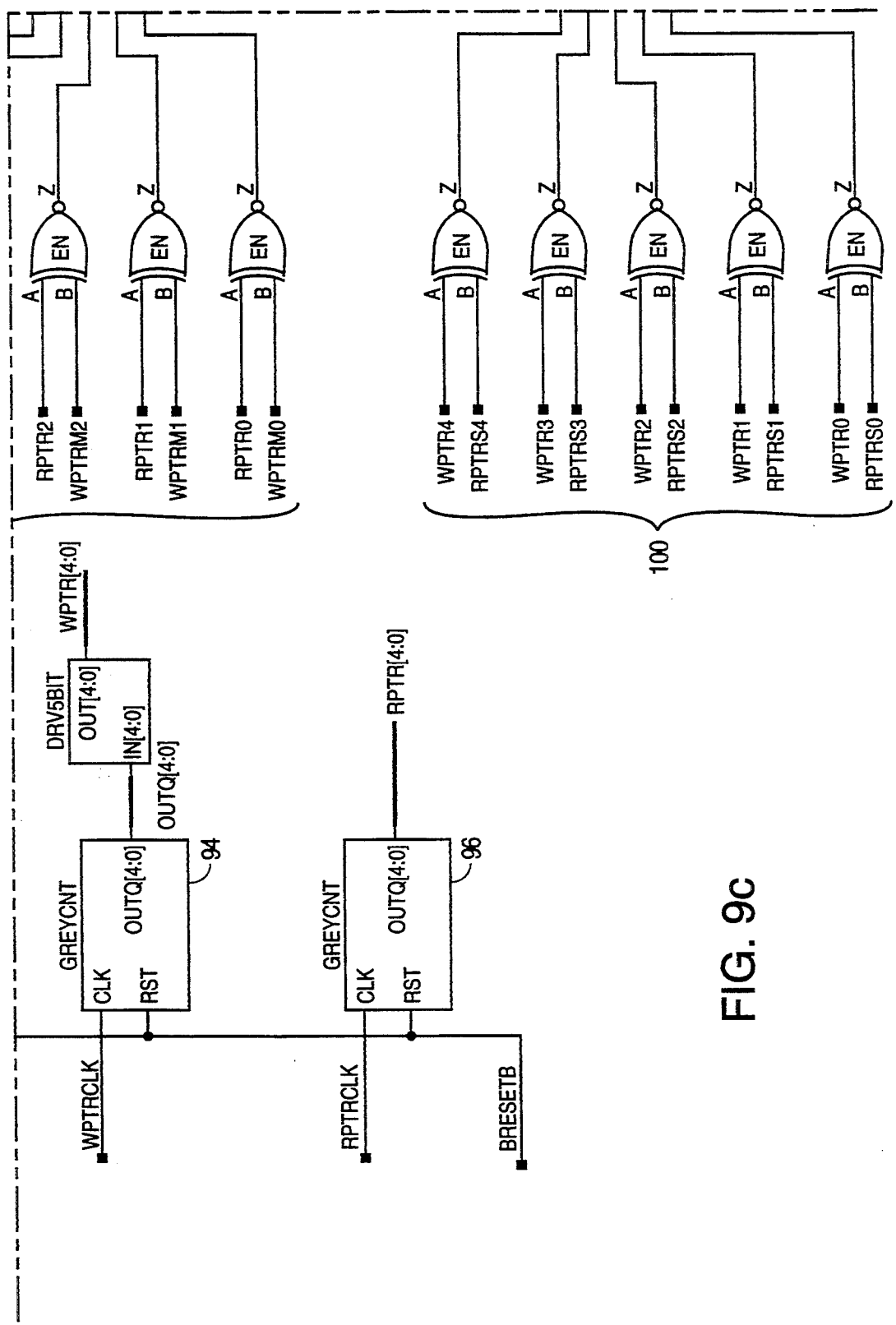
Figure 9D:
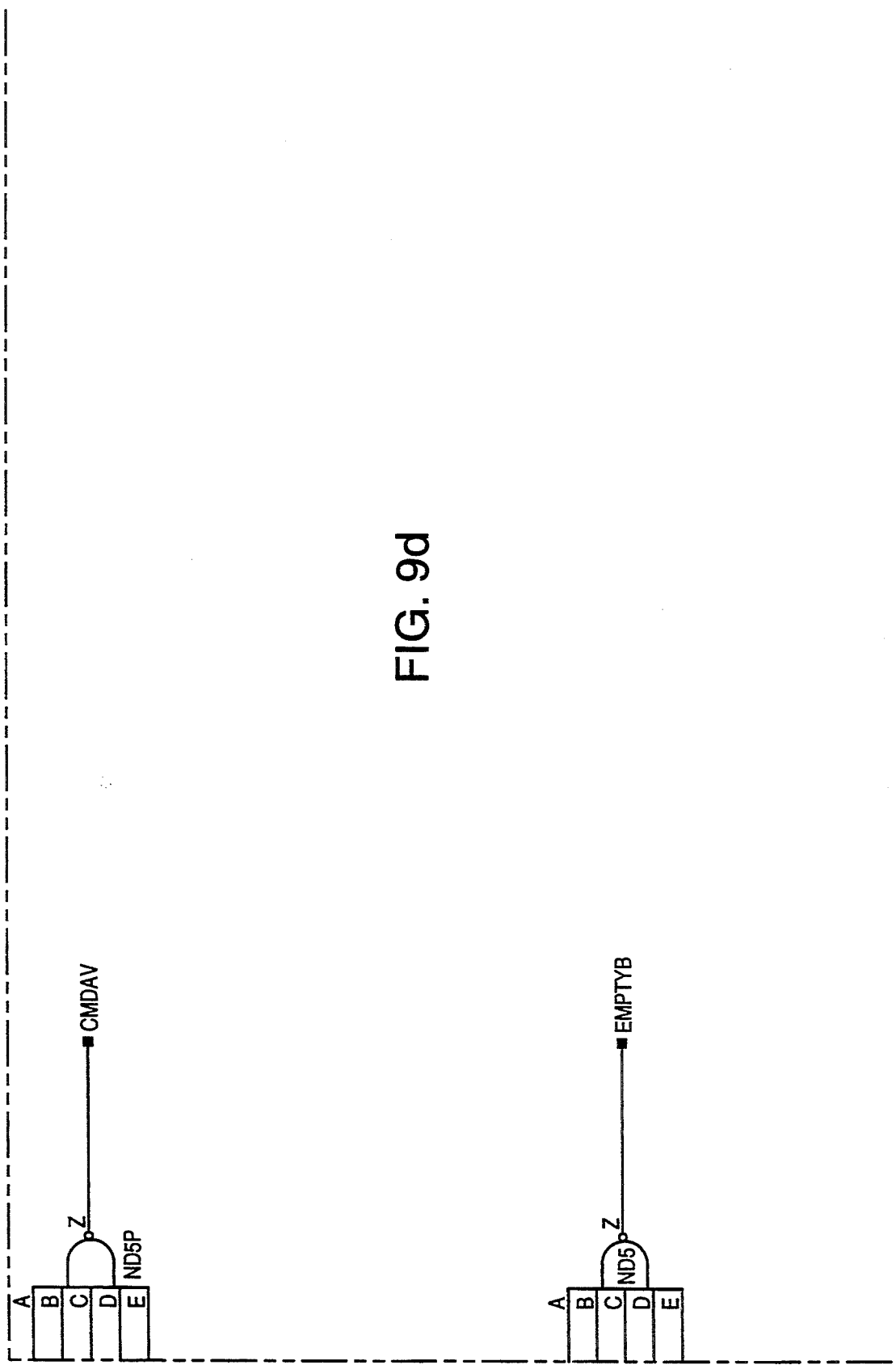

Shown in FIG. 9c are two Gray code counters 94 and 96. The upper Gray code counter 94 is clocked by the write pointer clock signal WPTRCLK, while being reset by the reset signal BRESTB. The lower Gray code counter 96 is clocked by the read pointer clock signal RPTRCLK and is reset by the same reset signal. Counters 94, 96 then provide on their five output bit buses the write pointer WPTR[4.0] and read pointer RPTR[4:0] respectively. As shown, the read pointer RPTR[4:0] and synchronized version of the write pointer WPTRM[4:0], and the write pointer WPTR[4:0] and the synchronized version of the read pointer RPTRS[4:0], are then provided to the respective logic arrays 102 and 100 for comparison to generate the CMDAV signal and the EMPTYB signal.

Figure 10A:
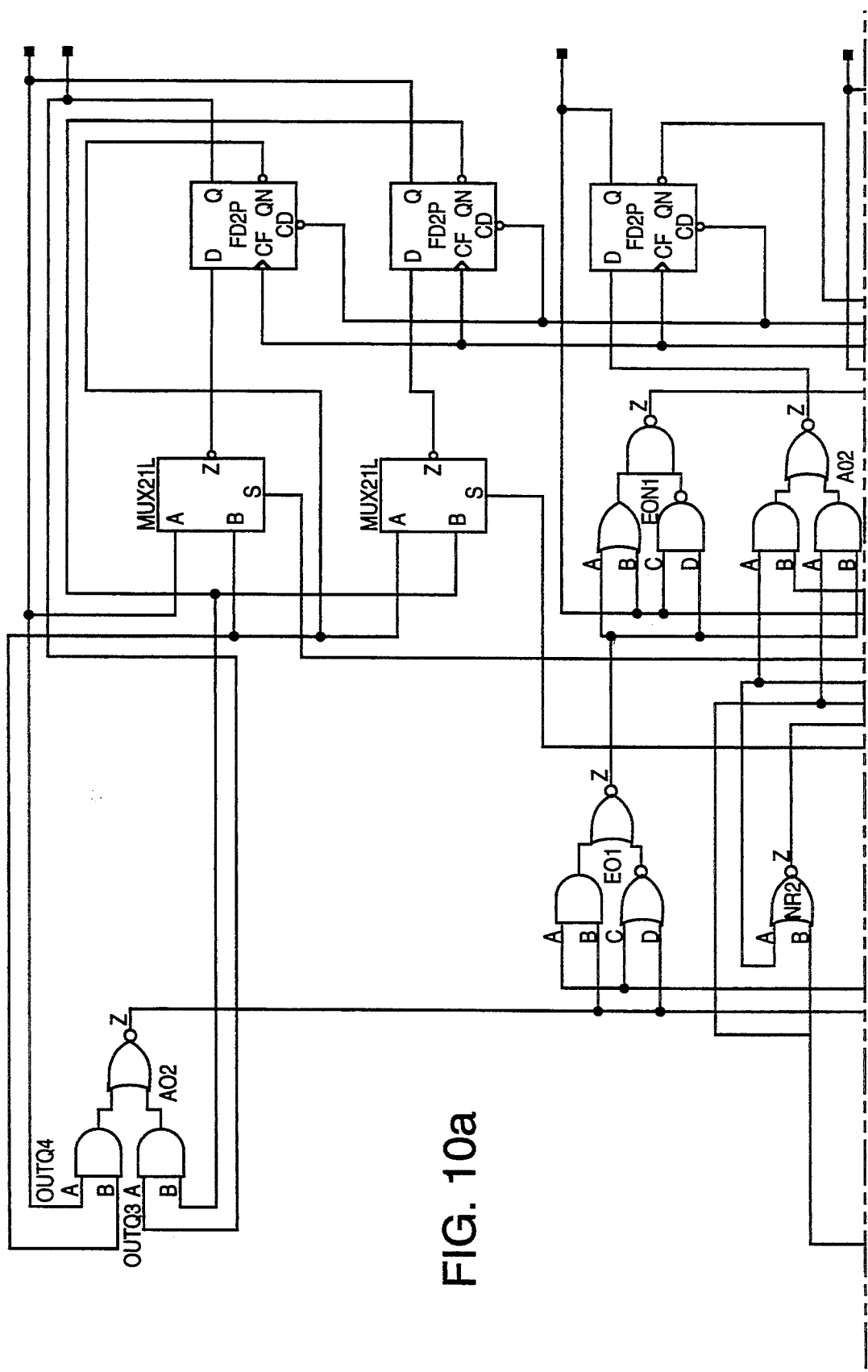
FIGS. 10a and 10b show in greater detail the structure of the Gray code counters used in the Gray code counter block of FIGS. 9a to 9d.
Figure 10B:
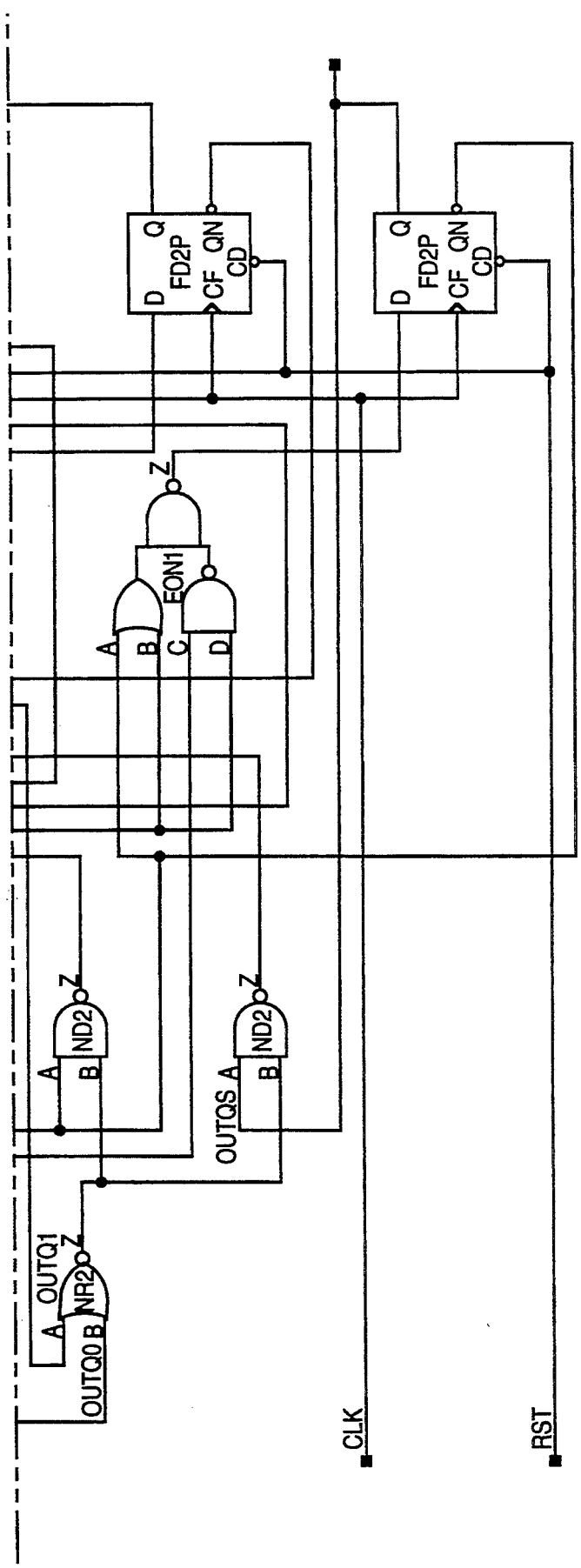
Figure 11A:
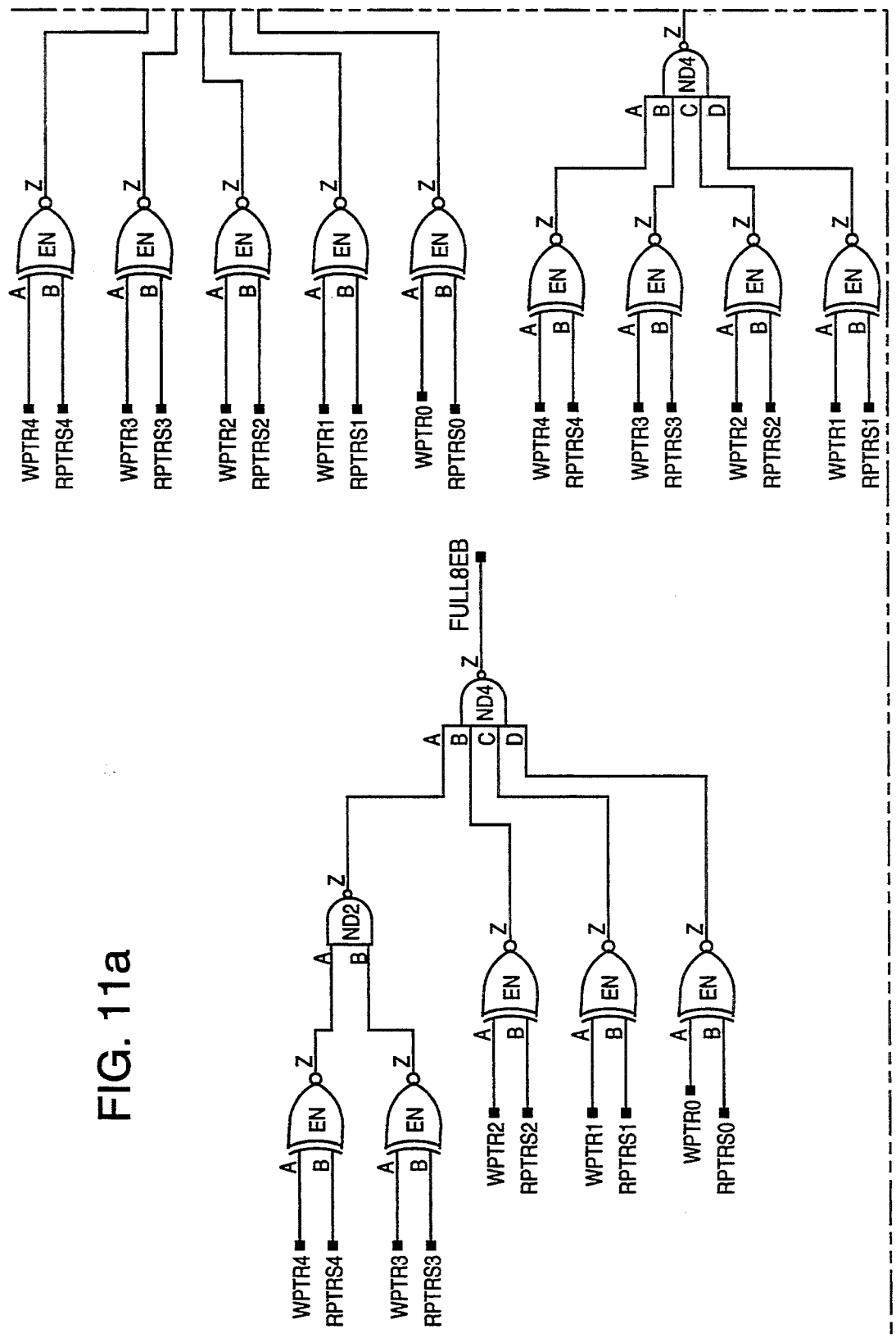
FIGS. 11a to 11d show in greater detail the structure of the Gray code comparator used in the Gray code counter block of FIGS. 9a to 9d.
Figure 11B:
Figure 11C:
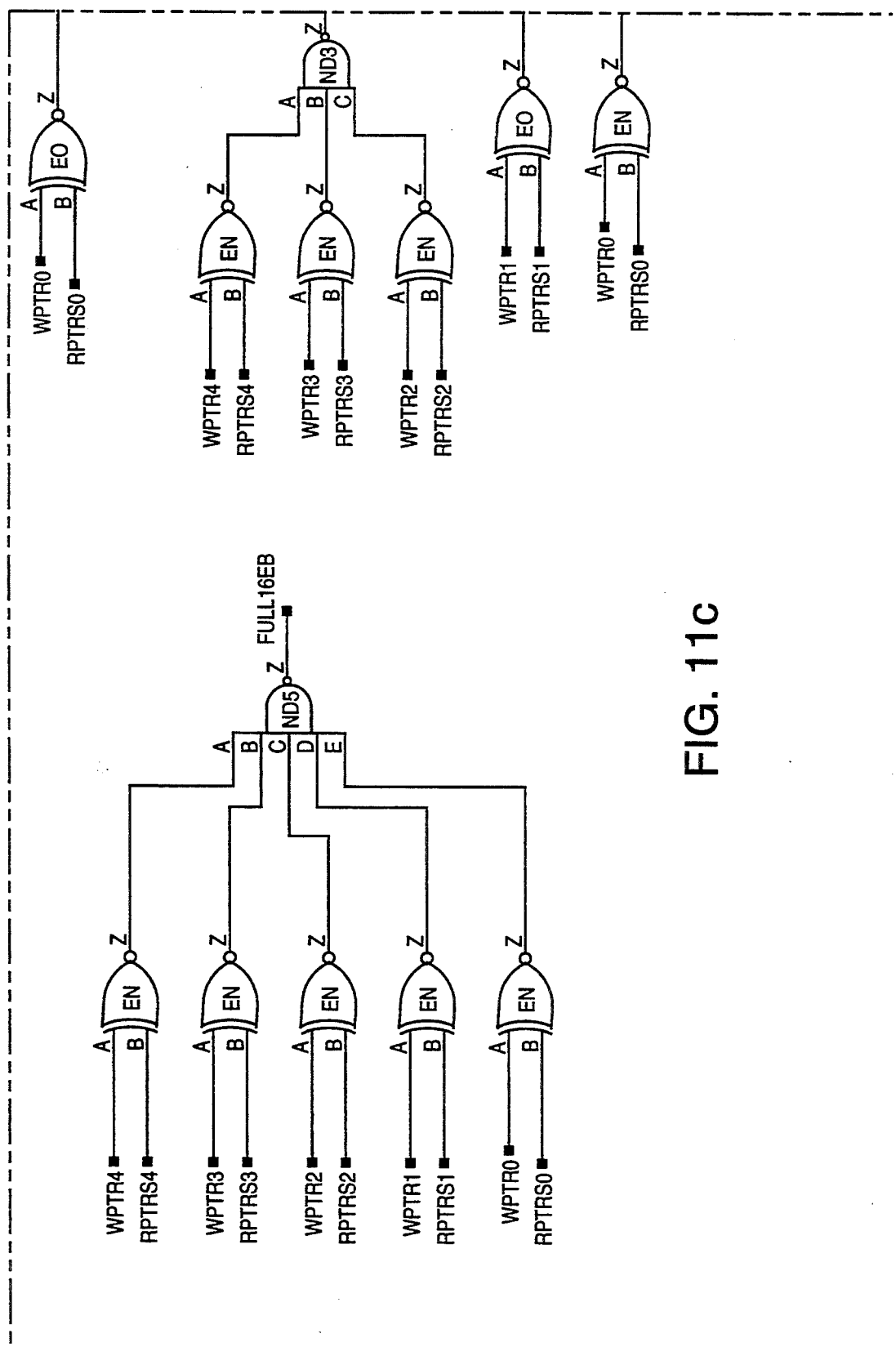
Figure 11D:
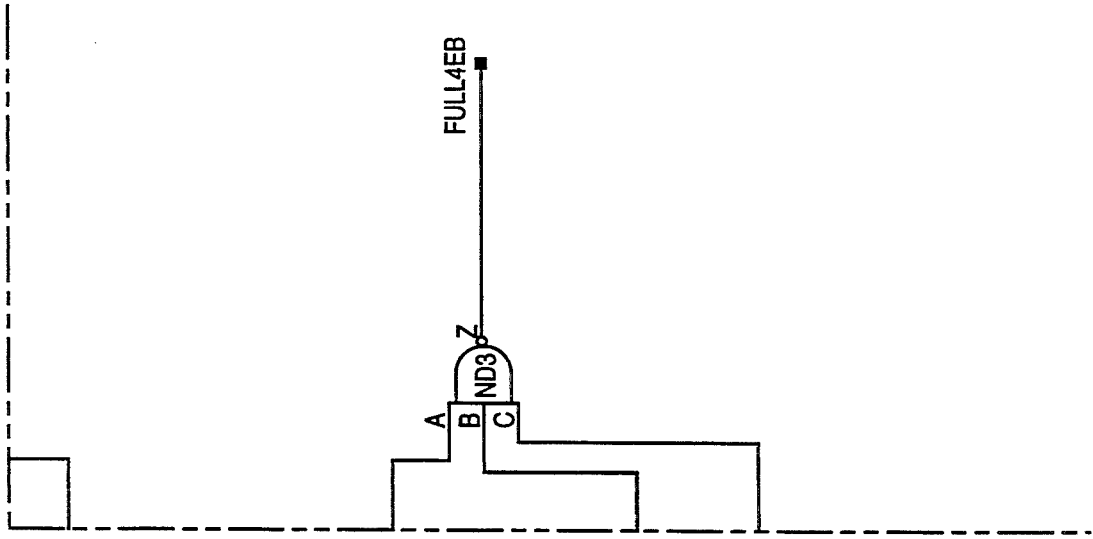

The identical Gray code counters 94 and 96 are shown in detail in FIGS. 10a and 10b (which shows only one of these counters). The counter of FIGS. 10a and 10b is a generic Gray code counter with the single input clock signal CLK.

The comparator block 70 of FIG. 9a is shown in detail in FIGS. 11a to 11d as one set of NAND'd exclusive NOR gates for each of the various depths of FIFO which are one, two, four, eight and sixteen, as designated by the numbers in the output signal label for each set of gates. (That is, FULL2EB is the full signal for two deep FIFO configuration.) The output of each of these sets of gates is the full signal for the particular depth of FIFO shown.

The above description of the invention is illustrative and not limiting. In particular, the particular logic structure shown here could be implemented in many different forms including, for instance, computer software or other types of logic gates, or other forms of logic structures. Also, as noted above, the structure and method in accordance with the invention are applicable to control of memories other than FIFO memory and to data channels other than memory wherever there is asynchronicity between the read path and write path.

We claim:

1. A memory controller for controlling a reading of data from and a writing of data to a memory having a plurality of locations, where the reading of data is asynchronous to the writing of data, comprising:
   two counters for indicating respectively which of the locations is currently being read from and written to;
   first and second Gray code counters, each having at least one more bit than needed for respectively indicating, in Gray code, which of the locations is currently being read from and written to the memory controller including a first synchronizer for synchronizing an output signal of the first Gray code counter to a system clock signal;
   comparator circuitry for comparing contents of the second Gray code counter to the synchronized output signal, and if the contents of the second Gray code counter and the synchronized output signal of the first Gray code counter are identical, indicating that all the locations of the memory are empty, and if the contents of tile second Gray code counter and the synchronized output signal of the first Gray code counter differ by a quantity equal to the number of locations in the memory as determined solely by the comparison indicating that all the locations of the memory are full.

2. The memory controller of claim 1, wherein the memory is a first-in-first-out (FIFO) memory and the memory controller controls the reading of data from and the writing of data to the first-in-first-out (FIFO) memory.

3. The memory controller of claim 1, wherein each of the full and empty indications are control signal flags generated by the memory controller.

4. The memory controller of claim 1, wherein the comparator circuitry includes a plurality of exclusive OR gates, there being one such gate for each bit in each of the first and second Gray code counters.

5. The memory controller of claim 1, the comparator circuitry further comprising a portion for indicating that some but not all of the locations of the memory are occupied.

6. The memory controller of claim 1, wherein the memory controller receives configuration information and the number of locations in the memory is configurable.

7. The memory controller of claim 6, further comprising a plurality of terminals for receiving configuration signals as the configuration information for indicating the number of locations in the memory, and a multiplexer controlled by the configuration signals for determining which of a plurality of outputs of the comparator circuitry will be used to generate a full indication.

8. The memory controller of claim 1, wherein the comparator circuitry includes two portions, the first portion comparing the synchronized output signal to the contents of the second Gray code counter, and providing the full indication, the second portion comparing the synchronized output signal to the contents of the second Gray code counter and providing the empty indication.

9. The memory controller of claim 8, the second Gray code counter further comprising a second synchronizer for synchronizing an output signal from the second Gray code counter to a read clock signal, and wherein the comparator circuitry includes a third portion for comparing the synchronized output signal from the second synchronizer to contents of the first Gray code counter.

10. A method for controlling a reading of data from and a writing of data to a memory having a plurality of locations, where the reading of data is asynchronous to the writing of data, comprising:
    indicating which of the locations is currently being read from and written to;
    providing two Gray code counters, each having at least one more bit than needed for respectively indicating in Gray code which of the plurality of locations is currently being read from and written to;
    indicating in a first of the two Gray code counters which of the locations is currently being read from;
    indicating in a second of the two Gray code counters which of the locations is currently being written to;
    synchronizing an output signal of the first of the Gray code counters to a system clock signal;
    comparing contents of the second of the Gray code counters to the synchronized output signal from the first of the Gray code counters;
    if the contents of the second of the Gray code counters and the synchronized output signal of the first of the Gray code counters are identical, providing a signal indicating that all the locations of the memory are empty of data; and
    if the contents of the second of the Gray code counters and the synchronized output signal of the first of the Gray code counters differ by a quantity equal to the number of locations in the memory, providing a signal indicating that all the locations of the memory are full of data.

11. The method of claim 10, further comprising the step of inputting configuration information to the memory controller, wherein the number of locations and the width of data at each location of the memory is configurable.

* * * * *